United States Patent [19]
Ozaki

[11] Patent Number: 4,938,924
[45] Date of Patent: Jul. 3, 1990

[54] COPPER DOPING OF EUTECTIC SOLDER
[75] Inventor: Thomas Ozaki, Dekalb, Ill.
[73] Assignee: AG Communication Systems Corporation, Phoenix, Ariz.
[21] Appl. No.: 481,095
[22] Filed: Feb. 16, 1990
[51] Int. Cl.$^5$ .................. C22C 13/00; B23K 35/34
[52] U.S. Cl. .................................. 420/558; 148/24
[58] Field of Search ........................ 420/558; 148/24
[56] References Cited
U.S. PATENT DOCUMENTS
4,070,192  1/1978  Arbib ................................ 420/558

Primary Examiner—Peter D. Rosenberg
Attorney, Agent, or Firm—Robert J. Black; Gregory G. Hendricks

[57] ABSTRACT

Eutectic solder, including a combination of tin, lead and silver is doped by the addition of copper to substantially improve its effectiveness in soldering printed wiring cards which have been screen printed with conductors and mounting pads for components, with a low temperature, thick film cermet copper conductor. The addition of the copper substantially improves wetting and increases long term solder joint reliability.

1 Claim, No Drawings

COPPER DOPING OF EUTECTIC SOLDER

BACKGROUND OF THE INVENTION

1. Field of the Invention

The present invention relates to the use of solder in printed wiring cards, and more particularly to the addition of copper doping of eutectic solders utilized in soldering printed wiring cards.

2. Background Art

In the field of screen printing copper conductors on printed wiring cards, it has been found desirable to utilize a low temperature thick film cermet copper conductor. Typical of such conductor material is the number 6001 copper, manufactured by E. I. DuPont.

In the usual arrangement, the copper conductors are screen printed over an alumina (aluminum oxide) substrate and dried at approximately 120 degrees centigrade to remove the organic vehicle, followed by sintering at approximately 600 degrees centigrade using a conveyor oven equipped with a nitrogen atmosphere with the addition of approximately 5 to 15 ppm of oxygen in accordance with the manufacturer's instructions. This conductive material is typically utilized to form pads for component mounting and also to form the necessary electrical interconnects between the circuit elements.

Thick film cermet copper conductors like the aforementioned DuPont number 6001 are difficult thick film materials to solder. It has been found that the conductor has a tendency to leech and form copper tin intermetallics (i.e., dewet about the perimeter of the conductor pad), or to produce areas of non-wetting depending upon the dip solder process in use.

Standard dip solder methodology in use by many manufacturers entails the use of an Alpha 611 flux manufactured by Alpha Metals Incorporated and the use of a eutectic solder combination that includes 62 parts tin, 36 parts of lead, and 2 parts of silver. Dip soldering then takes place at a temperature of between 245 and 260 degrees centigrade for a period of from 4 to 6 seconds. This methodology, however, typically may produce one of the two above stated undesirable conditions. It has been found that in order to achieve acceptable wetting characteristics one or more of the following actions were required. The first that it be necessary to reduce the solder temperature; second, increasing the preheat time after flux is applied; and third, to reduce the flow of the solder wave; or four, decreasing the duration of the dip.

Each of the above solutions has proved to have a definite disadvantage in that they increase process control requirements, increase set up time, and result in high rates of circuit repair. This is true particularly since the solerability of the DuPont 6001 copper is marginal at best utilizing standard solder techniques. However, in accordance with the teachings of the present invention a technique has been developed which produces a substantially improved solder joints with industry requirements for the visual characteristics of solder fillets without the added processing sensitivity and yield fallout.

SUMMARY OF THE INVENTION

The present invention involves the addition of copper in the amounts of approximately 0.2 to 0.3 percent by weight to eutectic solders, particularly to those solders that utilize a combination of 62 parts of tin, 36 parts of lead, and 2 parts of silver (by weight). The combination has been found highly desirable when soldering thick film cermet copper conductors such as DuPont 6001.

BRIEF DESCRIPTION OF THE DRAWINGS

No drawings are included in the present application.

DESCRIPTION OF THE PREFERRED EMBODIMENT

In accordance with the teachings of the present invention, it has been found desirable to add copper to eutectic solders, particularly to those combining 62 parts of tin, 36 parts of lead and 2 parts of silver (by weight). This has been found useful as an aid in soldering DuPont 6001 copper by means of a dip soldering process. By the addition of copper in concentrations of approximately 0.2 to 0.3 percent by weight, the solder characteristics are radically improved particularly as far as wetting is concerned of the DuPont 6001 copper and similar materials. It has been found that the new process produces fillets with excellent visual characteristics, i.e., good wetting angles and minimal de-wetting and/or non-wetting. The mechanism by which the copper improves wetability appears to be the result of a unique chemical change.

It has been generally considered that copper in solder is a contaminant. The Kester Solder Company, a well-known manufacturer of eutectic solders recommends having a total contamination level of less than 0.4 percent. It has been found that copper in the aforementioned ranges will not detrimentally affect the solder joint. If anything, it may be determined that the improved wetting increases long-term solder joint relibility.

While but a single embodiment of the present invention has been shown it will be obvious to those skilled in the art that numerous modifications may be made without departing from the spirit of the present invention which shall be limited only by the scope of the claims appended hereto.

What is claimed is:

1. A eutectic solder including in combination 62 parts of tin, 36 parts of lead, and 2 parts of silver, for use in the soldering of low temperature thick film cermet copper conductors as utilized on printed wiring cards, the improvement comprising:

adding to the eutectic solder combination, copper in the range of 0.2 to 0.3 percent by weight.

* * * * *